United States Patent
Hause et al.

[11] Patent Number: 6,163,059
[45] Date of Patent: Dec. 19, 2000

[54] INTEGRATED CIRCUIT INCLUDING SOURCE IMPLANT SELF-ALIGNED TO CONTACT VIA

[75] Inventors: Frederick N. Hause, Austin; Mark I. Gardner, Cedar Creek, both of Tex.

[73] Assignee: Advanced Micro Devices, Inc., Sunnyvale, Calif.

[21] Appl. No.: 09/148,127

[22] Filed: Sep. 4, 1998

Related U.S. Application Data

[62] Division of application No. 08/812,555, Mar. 7, 1997, Pat. No. 5,849,622.

[51] Int. Cl.$^7$ .................................................. H01L 29/76
[52] U.S. Cl. ............................................ 257/408; 257/369
[58] Field of Search ................................ 257/408, 369; 438/286

[56] References Cited

U.S. PATENT DOCUMENTS

| | | | |
|---|---|---|---|
| 4,561,170 | 12/1985 | Doering et al. | 29/571 |
| 4,599,789 | 7/1986 | Gasner | 29/571 |
| 4,621,412 | 11/1986 | Kobayashi et al. | 29/571 |
| 4,956,311 | 9/1990 | Liou et al. | 437/57 |
| 4,997,782 | 3/1991 | Bergonzoni | 437/44 |
| 5,036,019 | 7/1991 | Yamane et al. | 437/57 |
| 5,304,504 | 4/1994 | Wei et al. | 437/44 |
| 5,373,178 | 12/1994 | Motoyoshi et al. | 257/408 |
| 5,457,060 | 10/1995 | Chang | 437/34 |
| 5,512,506 | 4/1996 | Chang et al. | 437/44 |

(List continued on next page.)

FOREIGN PATENT DOCUMENTS

| | | |
|---|---|---|
| 0173953 | 3/1986 | European Pat. Off. . |
| 4110645 | 2/1991 | Germany . |
| 58-25270 | 2/1983 | Japan . |
| 63-196070 | 8/1988 | Japan . |
| 3-104215A | 5/1991 | Japan . |

OTHER PUBLICATIONS

Silicon Processing for the VLSI Era—vol. 2: Process Integration, by S. Wolf, published by Lattice Press, Sunset Beach, CA, 1990, p. 436.

*Primary Examiner*—Mark V. Prenty
*Attorney, Agent, or Firm*—Skjerven, Morrill, MacPherson LLP; Ken J. Koestner

[57] ABSTRACT

In the fabrication of an integrated circuit having both N MOSFETs and P MOSFETs in which the respective N-type species and P-type species have substantially different diffusivities, the source implant of the dopant species having a the higher diffusivity is advantageously delayed until a contact masking process step. By delaying the dopant species having the higher diffusivity, depletion of the dopant by subsequent annealing steps is avoided. P MOSFETs formed using a high diffusivity boron implant species in an integrated circuit including both P MOSFETs and N MOSFET are fabricated with no source implant in the source regions during formation of the gate electrodes and sidewall spaces. Once the gate and spacer structures on the surface of a substrate wafer are complete and a contact masking step is performed for patterning contact vias, typically in preparation for contact metallization, contact vias are cut to the surface of the substrate and the substrate in the source area exposed by the vias is implanted with the source dopant. A method of fabricating an integrated circuit includes forming a lightly-doped drain (LDD) MOSFET structure prior to source/drain doping. The LDD MOSFET structure includes a gate formed on a substrate over a gate oxide layer, spacers formed on sides of the gate, LDD doping of the substrate in a source region and a drain region self-aligned with the gate. The method further includes forming an oxide layer over the substrate and LDD MOSFET structure, cutting a contact via through the oxide layer to the substrate surface in the vicinity of the gate and spacer and abutting the source region of the substrate, and implanting a source implant through the contact via into the source of the LDD MOSFET structure.

22 Claims, 6 Drawing Sheets

U.S. PATENT DOCUMENTS

| | | | |
|---|---|---|---|
| 5,521,417 | 5/1996 | Wada | 257/369 |
| 5,547,885 | 8/1996 | Ogoh | 437/44 |
| 5,547,888 | 8/1996 | Yamazaki | 437/52 |
| 5,578,509 | 11/1996 | Fujita | 437/35 |
| 5,602,055 | 2/1997 | Nicholls et al. | 437/192 |
| 5,607,869 | 3/1997 | Yamazaki | 437/40 |
| 5,624,863 | 4/1997 | Helm et al. | 438/210 |
| 5,654,215 | 8/1997 | Gardner et al. | 438/286 |
| 5,656,518 | 8/1997 | Gardner et al. | 438/286 |
| 5,686,324 | 11/1997 | Wang et al. | 437/34 |
| 5,789,787 | 8/1998 | Kadosh et al. | 257/369 |
| 5,849,622 | 12/1998 | Hause et al. | 438/286 |

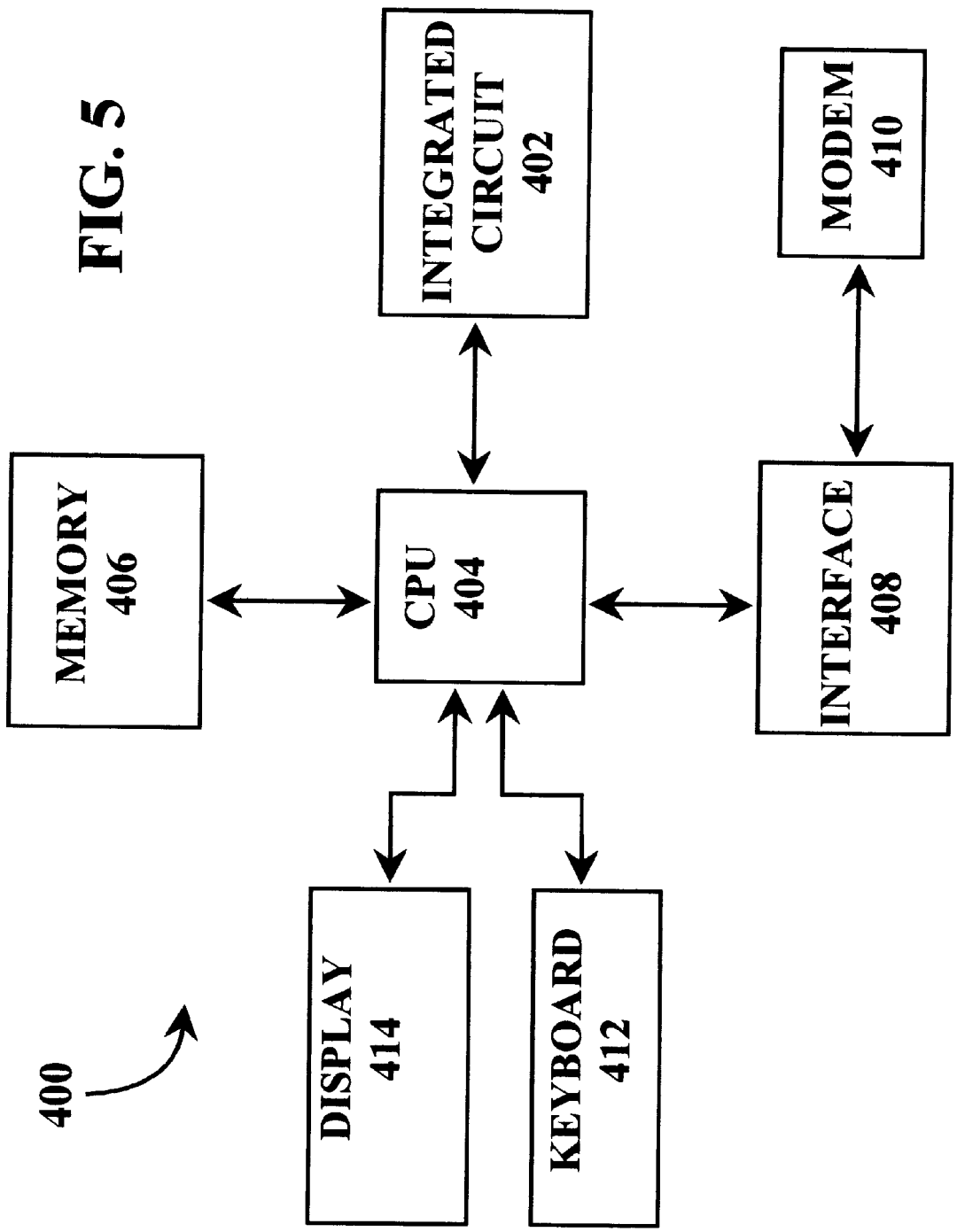

INTEGRATED CIRCUIT INCLUDING SOURCE IMPLANT SELF-ALIGNED TO CONTACT VIA

This application is a divisional of application Ser. No. 08/812,555 filed on Mar. 7, 1997, and now U.S. Pat. No. 5,849,622.

BACKGROUND OF THE INVENTION

1. Field of the Invention

The present invention relates to a process for fabricating an integrated circuit. More specifically, the present invention relates to an integrated circuit fabrication process that improves transistor performance by avoiding excessive diffusion of dopants during annealing.

2. Description of the Related Art

Many integrated circuit fabrication processes are used to remove harmful defects and impurities from regions of a substrate wafer and to activate dopants diffused or implanted into the wafer. Thermal processing does more than simply repair implantation damage. For example, thermal processes are commonly used to generate several types of changes in material properties of a substrate wafer. Thermal processing is highly useful for electrically activating or exciting the implanted impurity atoms. Upon implantation most implanted impurities do not occupy substitutional sites in the substrate. Thermal processing moves the implanted impurities to the substitutional sites.

Accordingly, thermal processing, such as rapid thermal processing (RTP) or rapid thermal annealing (RTA), is used in multiple steps of a device fabrication process for silicon wafers. Rapid thermal annealing (RTA) involves short-time, high temperature processing to avoid unwanted dopant diffusion that would otherwise occur at the high processing temperatures of 900° C. to 1000° C. or greater that are used to dissolve extended defects in silicon (Si) and gallium arsenide (GaAs). The duration of an RTA process ranges from seconds to a few minutes so that semiconductor substrates are subjected to high temperatures only long enough to attain a desired process effect but not so long that a large degree of dopant diffusion takes place.

During the fabrication of integrated circuits, silicon wafers are processed to create precisely-controlled regions of dopants to activate conductive devices for usage in an integrated circuit. Thermal processing removes defects in silicon substrate resulting from processing steps having a destructive effect. One example of a processing step having a destructive effect is ion implantation, the introduction of selected impurity dopants into a substrate using high-voltage ion bombardment to modify electronic properties of the substrate.

Unfortunately, thermal treatments disadvantageously cause dopants to diffuse, reducing control of the concentration and location of the dopants. For devices having feature sizes in the range of 0.1–0.5 μm or less, horizontal and vertical dopant diffusion must be reduced to maintain shallow junctions and controlled gate lengths. Two techniques have conventionally been used to minimize dopant diffusion including (1) low-temperature processing such as high-pressure oxidation and low-temperature CVD glass reflow, and (2) short-duration, high-temperature processing.

The temperature and the time duration of thermal processing are important processing parameters for determining functionality of fabricated integrated circuits. Suitable thermal processing involves application of thermal energy for a sufficient time and temperature to activate but not overly diffuse the dopants or impurities. A problem with thermal processing is that different dopants have different activation characteristics and diffusivities. The problem is magnified for rapid thermal processing because diffusivity differences between unlike dopants are amplified at high annealing temperatures. As a result, one dopant specifies may be insufficiently activated while a second dopant species is overannealed and diffused outside an intended channel so that control of transistor parameters is lost.

For example, semiconductor devices are typically fabricated by implanting boron as a P-type dopant and by implanting arsenic as an N-type dopant. After the dopants are implanted, the wafer upon which the semiconductor devices are formed is thermally annealed at a selected temperature and duration.

Under a particular set of rapid thermal processing conditions, a thermal processing step that is sufficient to activate the boron implant completely (100%) and to begin diffusing the boron outside the intended boundary for the $P^+$ region is only activates an arsenic implant partially (for example, 60%). As a result, the thermal processing produces imperfect semiconductor devices having distributed ion implant damage sites that are not electrically active. As a result, the resistivity of the semiconductor is increased both by interspersed implanted atoms that are not activated and by damage sites in the silicon lattice caused by the implant bombardment. The partially-activated arsenic implant having a significant percentage of the dopant in the $N^+$ region of a device without activation, results in a high $N^+$ sheet resistance and a high potential for charge traps.

If the thermal processing parameters are modified to fully activate the arsenic implant, for example by increasing the temperature of annealing, the boron implant becomes highly over-diffused since the diffusivity of boron is fast and is a strong, nearly exponential, function of temperature.

The different diffusivities of boron and arsenic particularly cause problems in integrated circuits that combine P MOSFETs and N MOSFETs on the same wafer. Conventional processing includes a step of implanting lightly-doped drain (LDD) and heavily doped source drain implants of both boron for P-type implants and arsenic for N-type implants early in the process cycle. Multiple annealing processes typically are performed subsequent to the doping steps. The annealing processes cause the boron in the P-type implants to diffuse much more rapidly than the diffusion of arsenic in the N-type implants, substantially depleting the boron in the doped regions.

For example, a typical process flow includes the steps of forming gate electrodes in the N MOSFET and the P MOSFET regions, implanting the $N^-$-type LDD implant and the $P^-$-type LDD implant with intervening photoresist stripping steps, and forming sidewall spacers on the gate electrodes. The process flow proceeds with steps of implanting a heavily doped $N^+$-type source drain implant in the N MOSFETs, followed by stripping of photoresist protecting the P MOSFET region. The P MOSFETs are then doped by implanting the $P^-$-type LDD implant and the heavily doped $P^+$-type source drain implant. Several rapid thermal annealing (RTA) steps are performed during this process to activate the transistors.

A problem arises because the boron $P^-$ LDD implant is very early in the process and boron diffuses very rapidly while the arsenic N-type implants diffuse slowly. For a sufficient annealing of the arsenic N-type implants, the boron P-type implants are diffused to the level of depletion. The boron implants cannot survive the heat of annealing.

What is needed is a technique for fabricating an integrated circuit including implanting and annealing multiple species of dopants having different diffusivities.

SUMMARY

In the fabrication of an integrated circuit having both N MOSFETs and P MOSFETs in which the respective N-type species and P-type species have substantially different diffusivities, it has been discovered that the source implant of the dopant species having a the higher diffusivity is advantageously delayed until a contact masking process step. By delaying the dopant species having the higher diffusivity, depletion of the dopant by subsequent annealing steps is avoided.

In accordance with an aspect of the present invention, P MOSFETs formed using a high diffusivity boron implant species in an integrated circuit including both P MOSFETs and N MOSFET are fabricated with no source implant in the source regions during formation of the gate electrodes and sidewall spacers. Once the gate and spacer structures on the surface of a substrate wafer are complete and a contact masking step is performed for patterning contact vias, typically in preparation for contact metallization, contact vias are cut to the surface of the substrate and the substrate in the source area exposed by the vias is implanted with the source dopant.

In accordance with one embodiment of the present invention, a method of fabricating an integrated circuit includes forming a lightly-doped drain (LDD) MOSFET structure prior to source/drain doping. The LDD MOSFET structure includes a gate formed on a substrate over a gate oxide layer, spacers formed on sides of the gate, LDD doping of the substrate in a source region and a drain region self-aligned with the gate. The method further includes forming an oxide layer over the substrate and LDD MOSFET structure, cutting a contact via through the oxide layer to the substrate surface in the vicinity of the gate and spacer and abutting the source region of the substrate, and implanting a source implant through the contact via into the source of the LDD MOSFET structure.

In accordance with another embodiment of the present invention, a method of fabricating an integrated circuit includes forming a plurality of lightly-doped drain (LDD) MOSFET structures prior to source/drain doping. The LDD MOSFET structures includes a gate formed on a substrate over a gate oxide layer, spacers formed on sides of the gate, LDD doping of the substrate in a source region and a drain region self-aligned with the gate. The LDD MOSFET structures include LDD P-MOSFET structures and LDD N-MOSFET structures. The LDD N-MOSFETs have a heavily-doped drain doping in the drain region self-aligned with the gate and spacers. The LDD P-MOSFETs are undoped in a drain region. The method further includes forming an oxide layer over the substrate and the LDD P-MOSFET structures and the LDD N-MOSFET structures and, for the LDD P-MOSFET structures and the LDD N-MOSFET structures, cutting a contact via through the oxide layer to the substrate surface in the vicinity of the gate and spacer and abutting the source region of the substrate. The method also includes implanting a source implant through the contact via into the source of the LDD P-MOSFET structure.

Many advantages are gained the described integrated circuit fabrication method. It is advantageous to form a P MOSFET for which a boron implant is exposed to only a small amount of annealing heat. Because P-channel dopants are highly sensitive to heat and are quickly dispersed when heat is applied, implanting the source implant at the contact masking process, a very late process in a process flow, advantageously sustains the level of P-type dopants in a channel. The described method advantageously improves the performance of P MOSFETs due to improved control of P-type dopant implants. The described process advantageously achieves improved performance with only small, simple and inexpensive changes to a process flow. The described process advantageously changes a process flow only in localized areas of a wafer.

By implanting P-type dopants in a contact masking stage of a process flow, a structure is attained with a P-channel source region formed adjacent to the gate electrode, a configuration that achieves an improved drive current for a P MOSFET.

In some embodiments, both the source and drain of the MOSFETs are formed at the contact masking step advantageously implanting both during the same masking operation. A source drain implant is advantageously avoided, simplifying the process flow for the fabrication of an asymmetric transistor.

BRIEF DESCRIPTION OF THE DRAWINGS

The features of the described embodiments believed to be novel are specifically set forth in the appended claims. However, embodiments of the invention relating to both structure and method of operation, may best be understood by referring to the following description and accompanying drawings.

FIG. 5 is a schematic block diagram illustrating a computer system including an integrated circuit including vertical transistors with spacer gates fabricated using a method as depicted in FIGS. 4A through 4G.

DETAILED DESCRIPTION OF THE ILLUSTRATIVE EMBODIMENTS

Figure 1A:
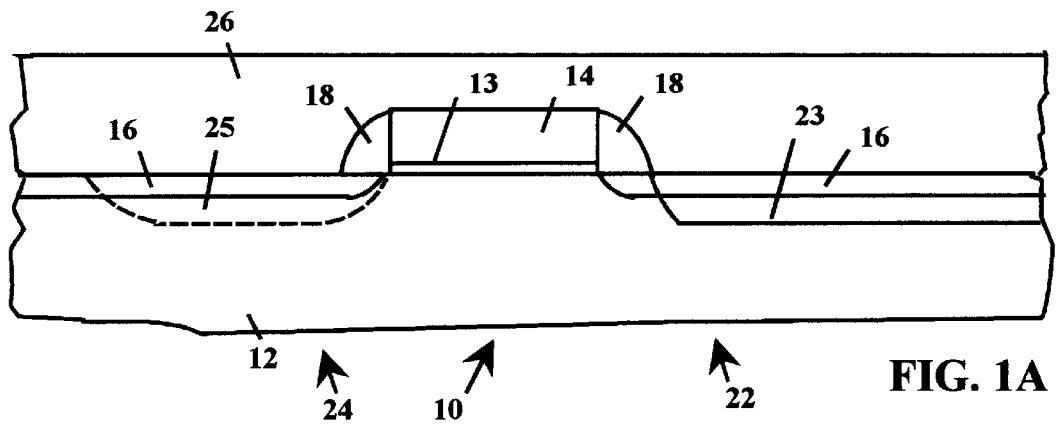
FIGS. 1A through 1C are a sequence of schematic cross-sectional views that depict a summary of a first embodiment of a fabrication process for forming an integrated circuit including a MOSFET source that is implanted during a contact masking operation of an integrated circuit fabrication process flow.
Figure 1B:
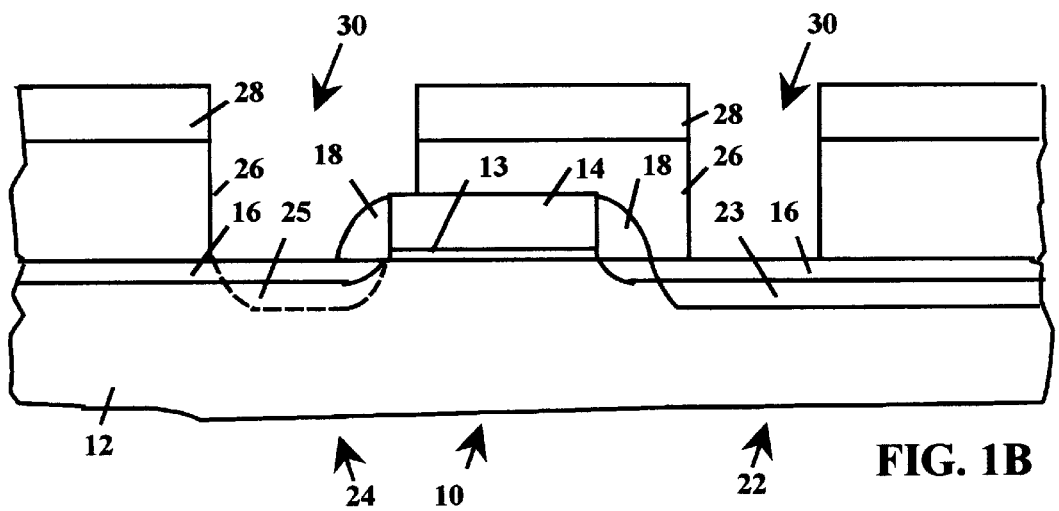
Figure 1C:
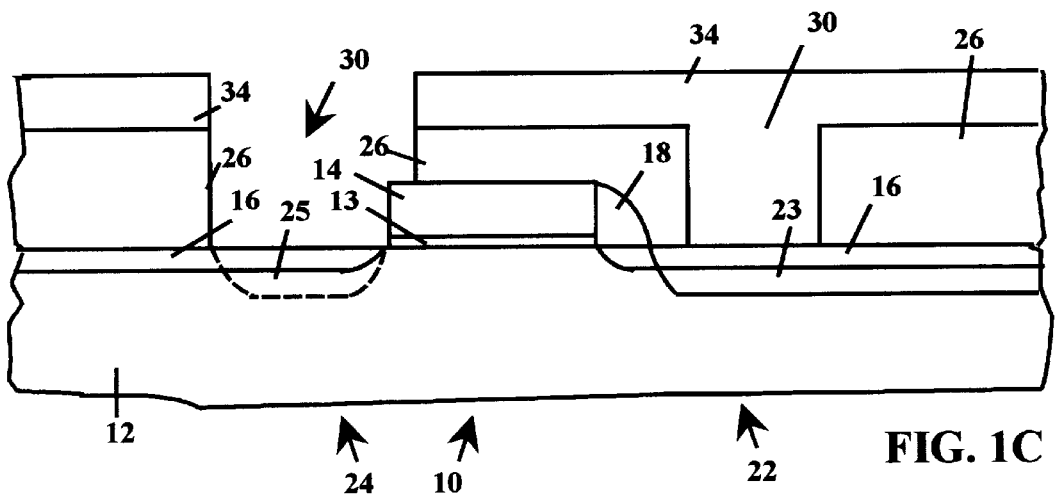

Referring to FIGS. 1A through 1C, a sequence of schematic cross-sectional views depict a summary of a first embodiment of a fabrication process for forming an integrated circuit including a MOSFET source that is implanted during a contact masking operation of an integrated circuit fabrication process flow.

FIG. 1A depicts a cross-sectional view of a MOSFET 10 formed on a substrate 12. In an illustrative embodiment, the MOSFET 10 is formed using lightly-doped drain (LDD) fabrication techniques including formation of a gate oxide layer 13 overlying the substrate 12, formation of a polysilicon gate 14, and implant of LDD regions 16 in the substrate 12 self-aligned with the polysilicon gate 14. Silicon dioxide spacers 18 are formed lateral to the polysilicon gate 14. In the illustrative embodiment, the spacers 18 are formed of silicon dioxide because silicon dioxide is an insulative material used to isolate the transistors from overlying conductive structures and etching of both the insulative material and selected spacers is desired in subsequent processing steps. The spacers may be formed from materials other than silicon dioxide. Advantages are gained for materials that are etched by silicon dioxide etching processes.

Following the formation of spacers 18 on the sides of the polysilicon gate 14 of an N MOSFET, a heavily-doped $N^+$ implant is performed for N-type devices in a drain region 23 on a drain side 22 of the N MOSFET. In some embodiments, a heavily-doped $N^+$ implant is performed for N-type devices in a source region 25 on a source side 24 of the N MOSFET. Typically, both the heavily-doped source drain $N^+$ implants for N MOSFETs are implanted in the source and drain regions.

Also following the formation of spacers 18 on the sides of the polysilicon gate 14 of a P MOSFET, in some embodiments no source drain implant is performed for either a source side 24 or a drain side 22 of the P-type devices. Accordingly, neither the sources nor the drains are formed in the devices until after the surface of the substrate 12 is isolated and contact vias are etched. In contrast, a conventional LDD process flow includes steps of performing a heavily-doped source drain implant in both a source region and a drain region of a device for both P-type devices and N-type devices.

Typically, a heavily-doped $P^+$ implant is performed for P-type devices in a drain region 23 on a drain side 22 of the P MOSFET but no source implant is performed in the source region 25 on the source side 24 of the P MOSFET.

FIG. 1A illustrates an embodiment in which the source region 25 on the source side 24 of a MOSFET 10 is not implanted but the drain region 23 on the drain side 22 of the MOSFET 10 is implanted with a heavily-doped drain implant. The illustrative condition is selectively performed in various embodiments for both P MOSFETs and N MOSFETs.

An interlayer dielectric oxide (ildo) layer of silicon oxide 26 is deposited over the substrate 12 and the polysilicon gate 14 and silicon dioxide spacers 18. The ildo layer of silicon oxide 26 is planarized.

Referring to FIG. 1B, a photoresist layer 28 is formed over the ildo layer of silicon oxide 26 and patterned. The ildo layer of silicon oxide 26 is etched to cut a contact via 30 through the ildo layer of silicon oxide 26 to the surface of the substrate 12, cutting through and removing the silicon dioxide spacer 18 and abutting the LDD regions 16 on the source side 24 of the MOSFET 10. On the drain side 22 of the MOSFET 10, a contact via 30 is etched through the ildo layer of silicon oxide 26 to the surface of the substrate 12 to contact the LDD region 16 and the heavily-doped drain region 23 on the drain side 22 of the MOSFET 10. The source region 25 is positioned directly adjacent to the polysilicon gate 14 so that the boron implant directly abuts the gate electrode, increasing the drive current of the MOSFET 10.

In various embodiments a source drain implant, a source implant, or no implant is applied to the MOSFET 10. Referring to FIG. 1C, the source region 25 on the source side 24 of a MOSFET 10 is not yet implanted but the drain region 23 on the drain side 22 of the MOSFET 10 is implanted with a heavily-doped drain implant. A photoresist layer 34 is deposited over the drain regions 23 and ions are implanted in the source regions 25 through the contact vias 30.

The fabrication process illustrated by FIGS. 1A through 1C attains many advantageous MOSFET structures in various embodiments. In one example, heavily-doped $P^+$ implants are implanted in P MOSFET sources during contact masking subsequent to the implant and annealing of heavily-doped $N^+$ implants in the sources and drains of N MOSFETs and also subsequent to the implant and annealing of heavily-doped $P^+$ implants in the drain of the P MOSFETs.

In another example of mixed P MOSFET and N MOSFET circuits, the sources for both P MOSFETs and N MOSFETs are doped during contact masking while the drains for both P MOSFETs and N MOSFETs are doped and annealed previously.

The illustrative process advantageously achieves an asymmetric transistor geometry in which P channel dopants such as boron are implanted subsequent to the implant and annealing of N-channel dopants. Advantageously, a P MOSFET is formed with doping of the $P^+$ boron implant at final stages of a process flow, avoiding exposure of the $P^+$ implant to much of the heat of thermal annealing.

Following the source implant operation, interconnects such as metal plugs are formed in the contact vias 30 making an ohmic connection to the LDD regions 16 on the source side 24 and the drain side 22 of the MOSFET 10. The interconnects are electrically connected to the additional interconnect structures for interconnecting multiple transistors and devices in an integrated circuit.

Figure 2A:
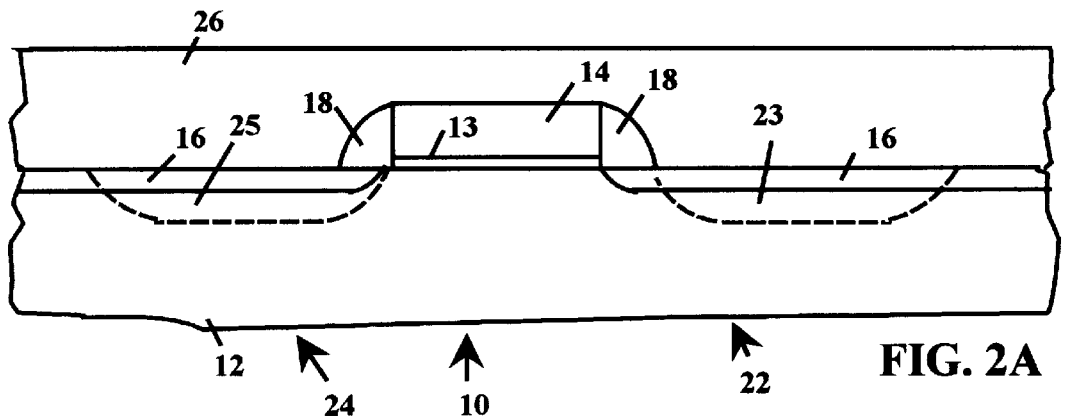
FIGS. 2A through 2C are a sequence of schematic cross-sectional views that depict a summary of a second embodiment of a fabrication process for forming an integrated circuit including a MOSFET source that is implanted during a contact masking operation of an integrated circuit fabrication process flow.
Figure 2B:
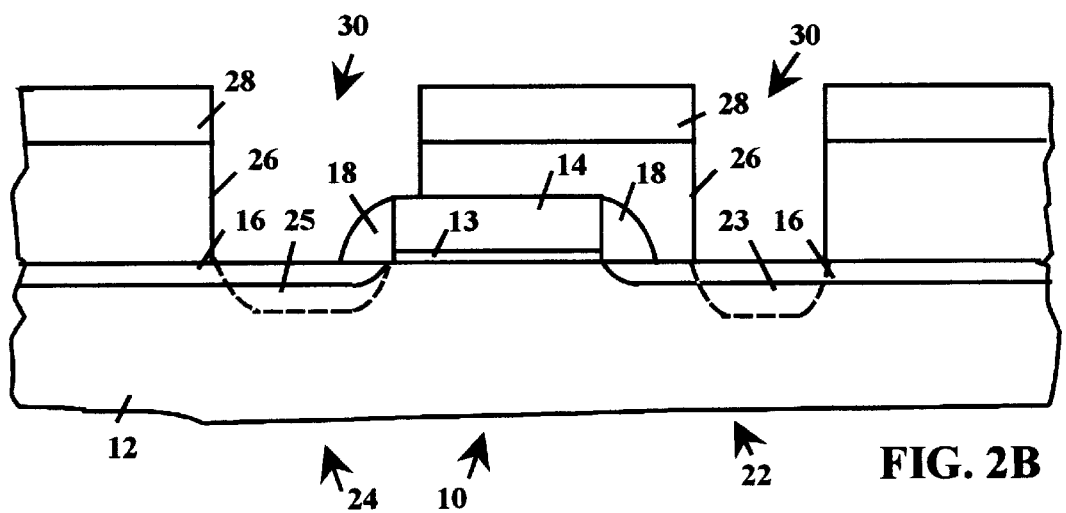
Figure 2C:
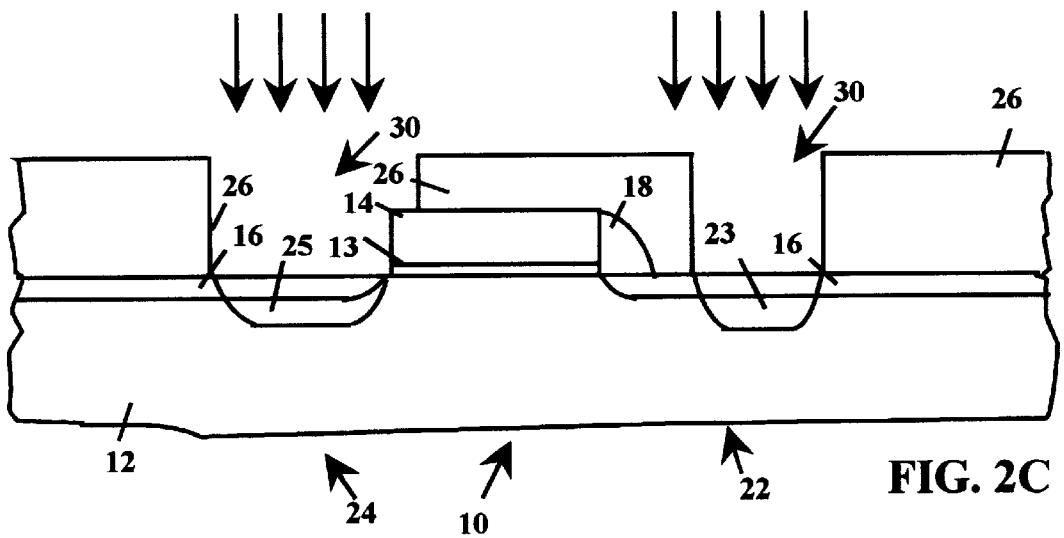

Referring to FIGS. 2A through 2C, a sequence of schematic cross-sectional views depict a summary of a second embodiment of a fabrication process for forming an integrated circuit including a MOSFET source that is implanted during a contact masking operation of an integrated circuit fabrication process flow.

FIG. 2A depicts a cross-sectional view of a MOSFET 10 formed on a substrate 12. In an illustrative embodiment, the MOSFET 10 is formed using lightly-doped drain (LDD) fabrication techniques including formation of a gate oxide layer 13 overlying the substrate 12, formation of a polysilicon gate 14, and implant of LDD regions 16 in the substrate 12 self-aligned with the polysilicon gate 14. Silicon dioxide spacers 18 are formed lateral to the polysilicon gate 14. Neither the drain region 23 on the drain side 22 of the polysilicon gate 14 nor the source region 25 on the source side 24 of the polysilicon gate 14 is implanted following the formation of the polysilicon gate 14 and the spacers 18 until the contact masking operation takes place.

Referring to FIG. 2B, photoresist layer 28 is formed over the ildo layer of silicon oxide 26 and patterned, and the layer of silicon oxide 26 is etched to the surface of the substrate 12, abutting the LDD regions 16 on the source side 24 and the drain side 22 of the MOSFET 10.

Referring to FIG. 2C, which is applicable to the fabrication of P MOSFETs and not generally to fabrication of N MOSFETs, neither the source region 25 on the source side 24 of a MOSFET 10 nor the drain region 23 on the drain side 22 of the MOSFET 10 is previously implanted with a heavily-doped drain implant. Both the drain regions 23 and the source regions 25 are implanted with $P^+$ boron ions. Both the source region 25 and the drain region 23 are implanted at a contact masking operation in the process flow so that the source and drain are advantageously implanted during the same masking operation. A source drain implant is advantageously avoided, simplifying the process flow for the fabrication of an asymmetric transistor.

The fabrication process illustrated by FIGS. 2A through 2C attains many advantageous MOSFET structures in various embodiments. In one example, heavily-doped P+ implants are implanted in P MOSFET sources and in P MOSFET drains during contact masking subsequent to the implant and annealing of heavily-doped N+ implants in the sources and drains of N MOSFETs.

In another example of mixed P MOSFET and N MOSFET circuits, the sources and drains for P MOSFETs and the sources of N MOSFETs are doped during contact masking while the drains for N MOSFETs are doped and annealed previously.

Figure 3A:
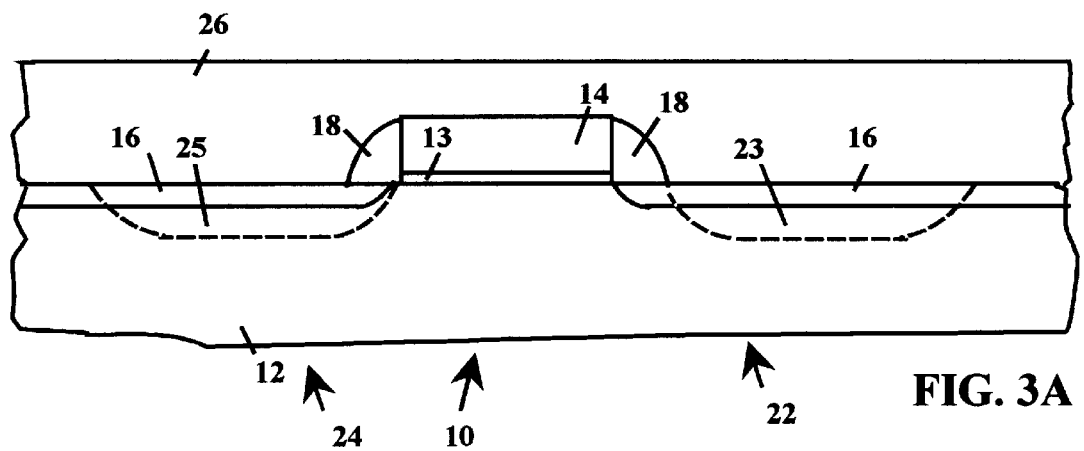
FIGS. 3A through 3C are a sequence of schematic cross-sectional views that depict a summary of a third embodiment of a fabrication process for forming an integrated circuit including a MOSFET source that is implanted during a contact masking operation of an integrated circuit fabrication process flow.
Figure 3B:
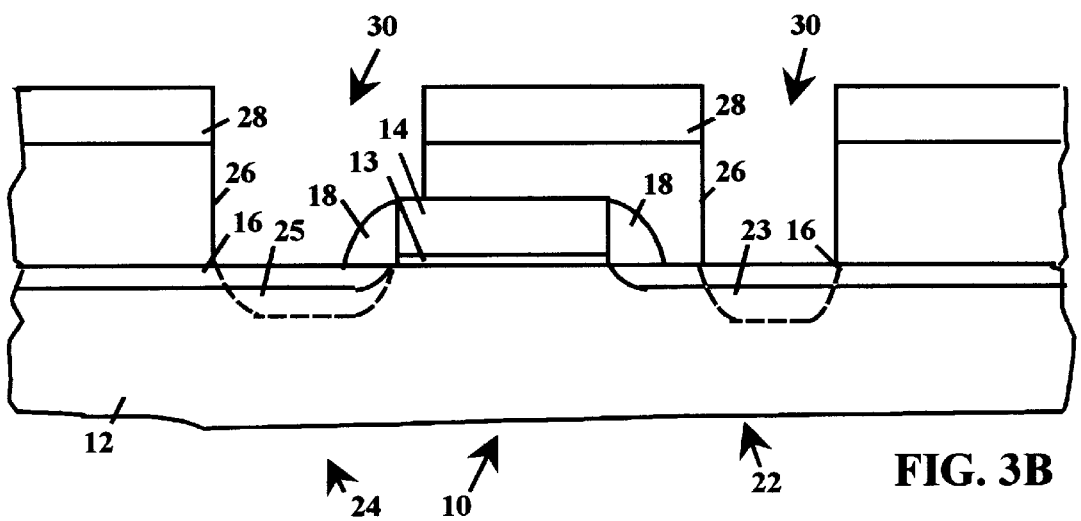
Figure 3C:
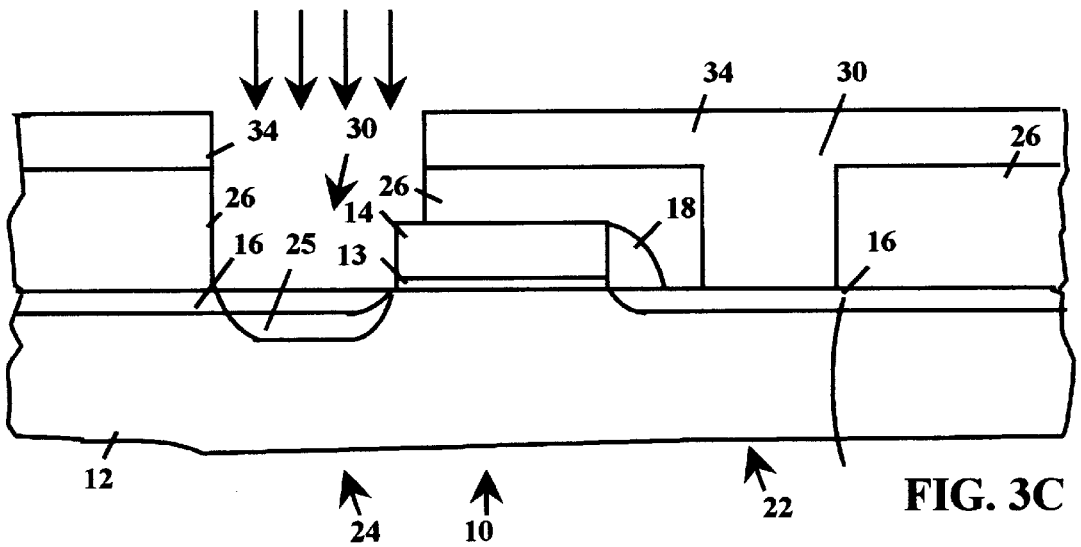

Referring to FIGS. 3A through 3C, a sequence of schematic cross-sectional views depict a summary of a third embodiment of a fabrication process for forming an integrated circuit including a MOSFET source that is implanted during a contact masking operation of an integrated circuit fabrication process flow.

FIG. 3A depicts a cross-sectional view of a MOSFET 10 formed on a substrate 12. In an illustrative embodiment, the MOSFET 10 is formed using lightly-doped drain (LDD) fabrication techniques including formation of a gate oxide layer 13 overlying the substrate 12, formation of a polysilicon gate 14, and implant of LDD regions 16 in the substrate 12 self-aligned with the polysilicon gate 14. Silicon dioxide spacers 18 are formed lateral to the polysilicon gate 14. Neither the drain region 23 on the drain side 22 of the polysilicon gate 14 nor the source region 25 on the source side 24 of the polysilicon gate 14 is implanted following the formation of the polysilicon gate 14 and the spacers 18 until the contact masking operation takes place.

Referring to FIG. 3B, photoresist layer 28 is formed over the ildo layer of silicon oxide 26 and patterned, and the layer of silicon oxide 26 is etched to the surface of the substrate 12, abutting the LDD regions 16 on the source side 24 and the drain side 22 of the MOSFET 10.

Referring to FIG. 3C, no heavily-doped drain implant is performed in some embodiments. A photoresist layer 34 is deposited over the drain regions 23 and ions are implanted in the source regions 25 through the contact vias 30. Accordingly, heavily-doped P+ implants are implanted in a P MOSFET source during contact masking while the P MOSFET drain is left undoped.

In a further example, heavily-doped P+ implants are implanted in a P MOSFET source during contact masking while the P MOSFET drain is left with only lightly-doped drain LDD doping.

In yet another example of mixed P MOSFET and N MOSFET circuits, the sources for both P MOSFETs and N MOSFETs are doped during contact masking while the drains for both P MOSFETs and N MOSFETs are undoped or lightly-doped (LDD) structures.

Figure 4A:
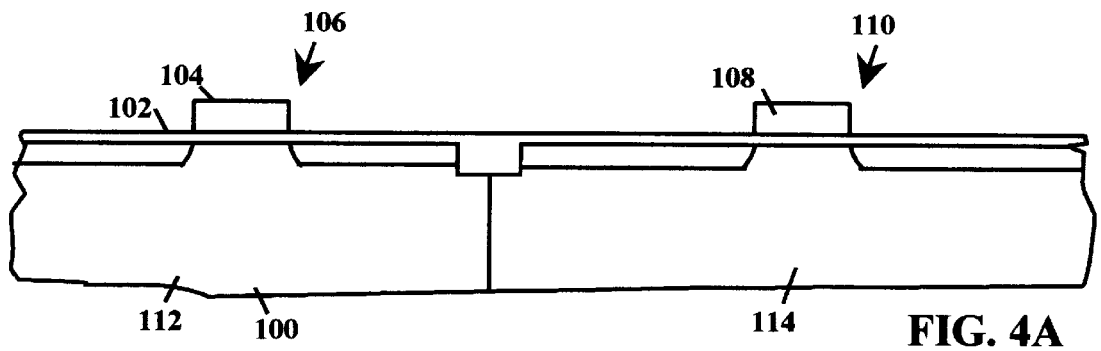
FIGS. 4A through 4H depict a sequence of schematic cross-sectional views of a silicon wafer during processing for forming an integrated circuit including formation of a MOSFET source that is detached or removed from the substrate.

FIGS. 4A through 4G show a series of schematic cross-sectional views of a silicon wafer 100 during processing for forming an integrated circuit including formation of a MOSFET source that is detached or removed from the substrate. Referring to FIG. 4A, an exemplary embodiment is shown in which NMOS devices in an N-well technology are formed in a lightly doped P-substrate having a P-type impurity concentration of greater than approximately $10^{15}/cm^3$ and PMOS devices are formed in a more heavily-doped N-type substrate having an impurity concentration of less than $10^{16}/cm^3$. The starting material is typically a heavily-doped <100>-orientation silicon substrate having a quality suitable for integrated circuit manufacture. A thin (5 $\mu$m to 10 $\mu$m) lightly-doped epitaxial layer is grown on the silicon substrate. The illustrative epitaxial layer is a P-type epitaxial surface layer with a <100> orientation and a resistivity of 12 ohm-cm. Either an n-epi-on-n+ or a p-epi-on-p+ substrate may be used for the epitaxial layer. The a p-epi-on-p+ substrate is more typically used due to a lesser sensitivity to process-induced defects. The silicon substrate and the epitaxial layer in combination form a silicon wafer 100.

Ions are implanted into the silicon wafer 100 to adjust a threshold voltage $V_T$. In embodiments including a P-layer, an N-layer, or both a P-layer and an N-layer, the threshold voltage $V_T$ is adjusted by ion implantation for both enhancement mode and depletion mode transistors. Ion implantation is used to set threshold voltage $V_T$, advantageously allowing the threshold voltage $V_T$ to be set independently of substrate doping, allowing substrate doping to be set on the basis of device performance alone. Adjustment of threshold voltage $V_T$ is achieved by implanting impurities such as boron, phosphorus, or arsenic ions into regions beneath the gate oxide of a MOSFET. Boron atoms positively shift threshold voltage $V_T$. Phosphorus or arsenic atoms negatively shift threshold voltage $V_T$. The threshold voltage $V_T$ adjustment implant is performed either with a single boron implant or separate p-type and n-type implants using additional masking steps.

In the illustrative embodiment, threshold adjustment implants, punchthrough implants, and well implants are implanted prior to growth of a gate-oxide layer on the silicon wafer 100 surface. In various embodiments, threshold adjustment implants and punchthrough implants may be performed either before or after formation of a trench or before or after gate-oxide growth. In conventional devices, the threshold voltage $V_T$ adjustment implant is injected through an oxide layer to limit depth of the boron threshold adjustment implant to a shallow depth. A suitable threshold voltage $V_T$-adjust implant energy forms an implant with a peak concentration at the oxide-silicon interface. A subsequent implant-activating anneal operation distributes the implanted ions more broadly than the implanted profile.

In an illustrative embodiment, a threshold voltage $V_T$ adjustment implant for enhancement-mode devices is performed. For example, boron is implanted at a concentration in a range from approximately $10^{12}$ to $10^{13}$ atoms/cm$^2$ and an energy in the range from about 50 keV to 100 keV, an energy insufficient to penetrate a trench or field oxide isolation (not shown). The $V_T$ adjustment implant for enhancement-mode devices is typically performed without masking.

A threshold voltage $V_T$ adjustment implant for depletion-mode devices is performed by implanting areas of depletion-mode devices with phosphorus or arsenic atoms at a concentration of about $10^{12}$ atoms/cm$^2$ and an implant energy in the range of about 100 keV. The implant dosage is adjusted to overcompensate for the boron threshold voltage $V_T$ adjustment implant for enhancement-mode devices. The depletion-mode implant is performed with a photoresist mask to selectively locate the depletion-mode transistor channels.

A layer of silicon dioxide with a thickness in the range of 30 Å to 150 Å forms a gate oxide layer 102 on the top surface of the silicon wafer 100 by tube growth at a temperature of 700° C. to 1000° C. in an O$_2$ ambient.

In the illustrative embodiment, a polysilicon gate 104 for a P-channel transistor 106 and a polysilicon gate 108 for an N-channel transistor 110 are formed by depositing a layer of undoped polysilicon to a thickness of approximately 2000 Å by low pressure chemical vapor deposition (LPCVD) over the gate oxide layer 102. The polysilicon is doped using a technique selected from among several suitable techniques including doping in situ during deposition and doping prior to etching by implanting arsenic atoms with a dosage in a range from $1 \times 10^{15}$ to $5 \times 10^{15}$ atoms/cm$^2$ and an energy in a range from 2 to 50 kiloelectron-volts (keV). In another example, polysilicon is doped in a subsequent process step during introduction of dopant into the silicon wafer 100. The polysilicon gates 104 and 108 are formed by depositing a photoresist mask (not shown) in a continuous layer over the polysilicon layer and irradiating the photoresist mask using a photolithographic system. The photolithographic system projects I-line ultraviolet light from a mercury-vapor lamp through a reticle and a focusing lens to form a predetermined image pattern on the photoresist mask. The photoresist mask is developed and irradiated portions are removed to form openings in the mask. An anisotropic dry etch etches the polysilicon layer to form the polysilicon gates 104 and 108 with substantially vertical side walls using an etching process that is highly selective of polysilicon. A reactive ion etch (RIE) removes the regions of gate oxide layer 102 except for portions underlying the polysilicon gates 104 and 108. The photoresist mask is stripped.

The polysilicon gate 104 of the P-channel transistor 106 overlies a region of N-doped substrate 112, such as an N-well. The polysilicon gate 108 of the N-channel transistor 110 overlies a region of P-doped substrate 114.

Figure 4B:
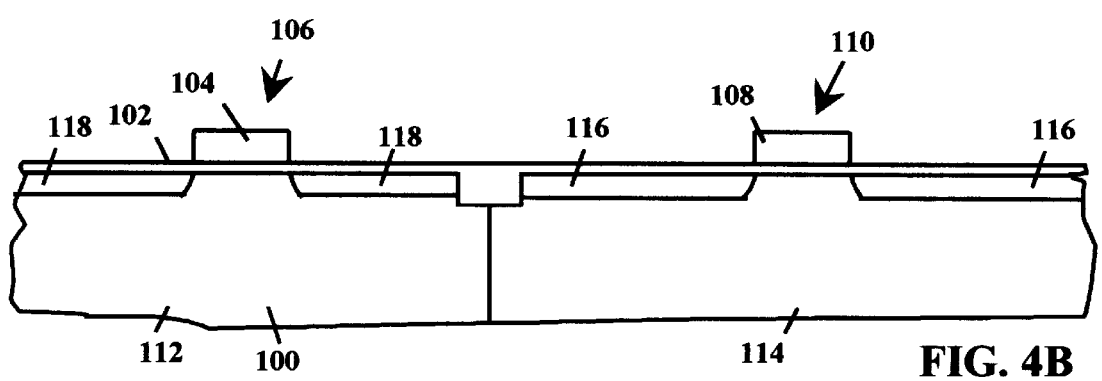

Referring to FIG. 4B, a first masking step and a first ion implant step form a N⁻ LDD implant and include applying a lightly-doped drain (LDD) mask to the silicon wafer 100 and implanting N⁻ ions to form N-channel transistor LDD regions 116 which are self-aligned with the polysilicon gate 108. The N⁻ ion implantation process includes implanting arsenic at a dosage in the range of $2 \times 10^{14}$ to $5 \times 10^{14}$ atoms cm$^2$ and an energy in the range of 2 to 50 keV, using the polysilicon gate 108 as an implant mask. A second masking step and a second ion implant step form a P⁻ LDD implant and include applying a lightly-doped drain (LDD) mask to the silicon wafer 100 and implanting P⁻ ions to form P-channel transistor LDD regions 118 which are self-aligned with the polysilicon gate 104. The P⁻ ion implantation process includes implanting boron at a dosage in the range of $2 \times 10^{14}$ to $5 \times 10^{14}$ atoms/cm$^2$ and an energy in the range of 2 to 50 keV, using the polysilicon gate 104 as an implant mask.

Figure 4C:
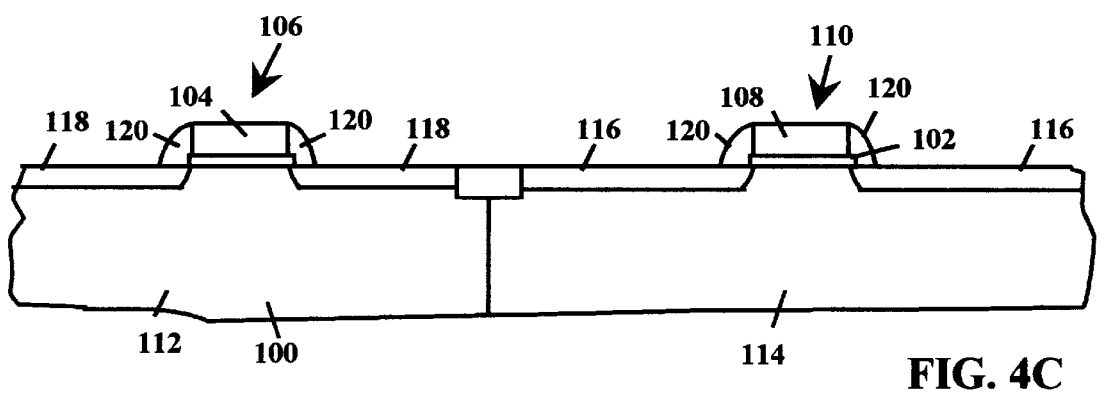

Referring to FIG. 4C, silicon dioxide spacers 120 are formed on the substantially vertical side walls of the P-channel polysilicon gate 104 and the N-channel polysilicon gate 108. The silicon dioxide spacers 120 are formed by conformally depositing a layer of silicon dioxide (oxide) overlying the gate electrodes 104 and 108 and the surface of the silicon substrate 102 to a thickness in the range of 200 Å to 2000 Å by chemical vapor deposition (CVD) at a temperature in the range of 300° C. to 400° C. The silicon dioxide layer 132 is etched using a reactive ion etch (RIE) procedure that forms the silicon dioxide spacers 120 adjacent to the edges of the polysilicon gates 104 and 108.

The form of the P-channel transistor LDD regions 118 and the N-channel transistor LDD regions 116 determines the hot carrier performance of the transistors and is established by the profile of the silicon dioxide spacers 120. The spacer profile varies as a function of the spacer oxide etch time and the spacer oxide thickness. A suitable amount of over-etch is used to form the silicon dioxide spacers 120. However, excessive over-etching reduces the width and height of the silicon dioxide spacers 120 and causes gouging into the silicon of the silicon wafer 100. Control of the over-etch process becomes more difficult as the deposited spacer oxide layer thickness increases.

In alternative embodiments, materials other than silicon dioxide may be employed as spacers on the gate electrodes. Advantages are gained by using a spacer material that is etched by the process that etches a silicon dioxide (oxide) layer.

Figure 4D:
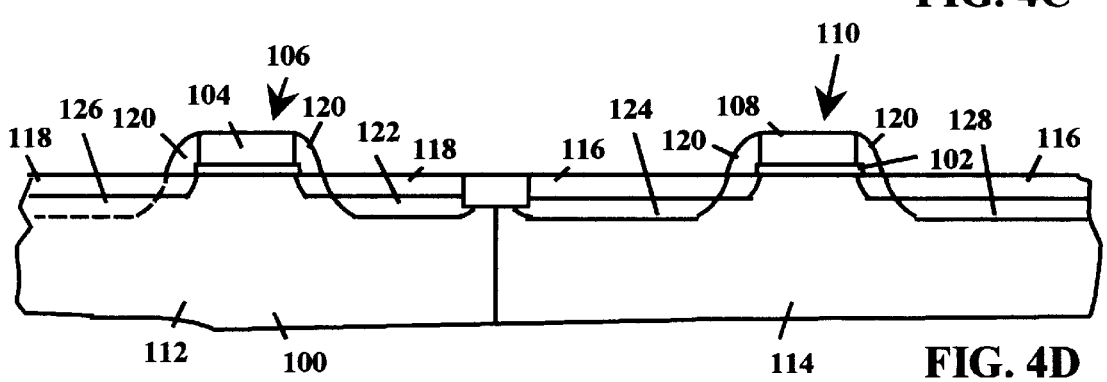

Referring to FIG. 4D, heavily doped drain regions including a P-channel drain region 122 and an N-channel drain region 124 are implanted into the silicon wafer 100 by applying separate mask and implant processes for the P-channel transistor 106 and the N-channel transistor 110. The heavily-doped P-channel drain region 122 is implanted by injecting boron atoms into a portion of the surface of the silicon wafer 100 that is self-aligned with the polysilicon gate 104 and the silicon dioxide spacer 120 on the drain side of the P-channel transistor 106. The boron atoms are implanted at a dosage in the range of $1 \times 10^{15}$ to $5 \times 10^{15}$ atoms/cm$^2$ and an energy in the range of 10 KeV to 80 KeV to produce a boron concentration in the range of about $1 \times 10^{18}$ to $5 \times 10^{20}$ atoms/cm$^3$ and a junction depth in the range of 200 Å to 3000 Å. Boron ions are very light ions and a very low energy must be used to provide a shallow boron ion implant. If too high an energy is used, the light ions are implanted at too great a depth. However, when the implanting energy is low, the beam current is also too low so that the time taken to perform the implant is excessive.

The heavily-doped N-channel drain region 124 and the heavily-doped N-channel source region 128 are implanted by injecting arsenic atoms into a portion of the surface of the silicon wafer 100 that is self-aligned with the polysilicon gate 108 and the silicon dioxide spacer 120 on the drain side of the N-channel transistor 110. The arsenic atoms are implanted at a dosage in the range of $1 \times 10^{15}$ to $5 \times 10^{15}$ atoms/cm$^2$ and an energy in the range of 2 to 50 keV to produce an arsenic concentration in the range of about $1 \times 10^{18}$ to $5 \times 10^{20}$ atoms/cm$^3$ and a junction depth in the range of 200 Å to 3000 Å.

The junction depth of the P-channel drain region 122 and the N-channel drain region 124 are deeper than the depth of respective P channel transistor LDD regions 118 and N-cannel transistor LDD regions 116. The dopant concentration of the P-channel drain region 122 and the N-channel drain region 124 are sufficiently large to attain a conductive state of the respective P-channel polysilicon gate 104 and N-channel polysilicon gate 108 when connected to a suitably doped source.

The silicon wafer 100 is annealed to remove crystalline damage and activate and drive-in the implanted arsenic using a rapid thermal anneal process at a temperature in a range from 950° C. to 1050° C. for 10 to 60 seconds. The implanted boron in the silicon wafer 100 diffuses laterally and vertically, merging the P-channel drain region 122 with the P-channel transistor LDD region 118 in the vicinity of the P-channel drain region 122. The implanted arsenic in the silicon wafer 100 diffuses laterally and vertically to merge the N-channel drain region 124 with the N-channel transistor LDD regions 116 in the vicinity of the N-channel drain region 124.

Following implanting of the P-channel drain region 122 and the N-channel drain region 124, the P-channel transistor 106 has a P-channel source region 126 that is not doped. Thus, the illustrative semiconductor structure, in contrast to conventional LDD structures, has no implant dopant in source region of the P-channel transistor 106 except for LDD doping. In contrast, the N-channel transistor 110 is fully implanted with an N-type source drain implant.

In some method embodiments, special processing is performed only on P-channel transistors 106 on the source side of a transistor to achieve a shallower junction on the source side alone. The remainder of the process flow advantageously may be a conventional process flow with conventional formation of the drain.

Figure 4E:
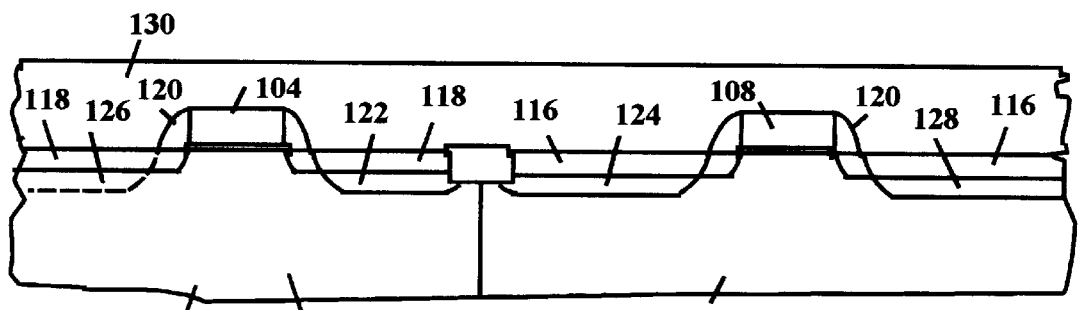

Referring to FIG. 4E, a blanket layer of silicon oxide ($SiO_2$) 130 is formed over the silicon wafer 100, covering the polysilicon gate 104 and silicon dioxide spacers 120 of the P-channel transistor 106 and the polysilicon gate 108 and silicon dioxide spacers 120 of the N-channel transistor 110. The oxide layer 130 with a thickness in the range of 5000 Å to 20000 Å is conformally deposited over the silicon wafer 100 by chemical vapor deposition (CVD) at a temperature in the range of 300° C. to 400° C.

Figure 4F:
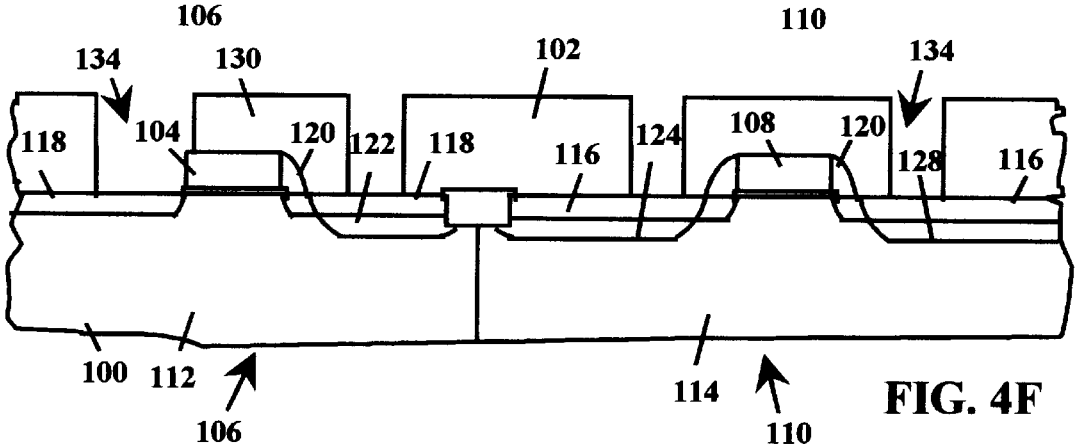

Referring to FIG. 4F, a contact via-defining photoresist mask is patterned over the oxide layer 130. The contact via-defining photoresist mask is deposited in a continuous layer on the oxide layer 130 and irradiated using the photolithographic system to form a predefined two-dimensional image pattern on the horizontal planar surface of the oxide layer 130. The contact via-defining photoresist mask defines a plurality of contact vias 134 for accessing and electrically connecting the surface of the silicon wafer 100 adjacent to selected source regions such as the P-channel source region 126 and the N-channel source region 128 and selected drain regions such as the P-channel source region 126 and N-channel source regions 128 from the an interconnect layer (not shown). The contact via-defining photoresist mask is developed and irradiated portions of the mask are removed to expose the oxide layer 130 overlying the prospective locations of the contact vias 134. In the illustrative embodiment, the contact via-defining photoresist mask forms a contact via 134 extending fully over a spacer.

The oxide layer 130 is etched using a reactive ion etch (RIE) that etches the contact vias 134 to the surface of the silicon wafer 100. The reactive ion etch (RIE) etches the oxide layer 130 and portions of the silicon dioxide spacers 120 that are exposed by the contact via-defining photoresist mask.

In the illustrative embodiment, the contact via-defining photoresist mask is patterned in the region of the P-channel source region 126 so that the entire silicon dioxide spacer 120 on the source side of the P-channel transistor 106 is exposed to etching. The contact via-defining photoresist mask positions the P-channel source region 126 directly adjacent to the gate electrode 104 so that the boron implant directly abuts the gate electrode 104, increasing the drive current of the transistor. Typically, a ten to fifteen percent increase in drive current is attained by placement of the source region adjacent to the gate electrode 104.

In contrast, the contact via-defining photoresist mask is patterned so that the contact via 134 in the vicinity of the P-channel drain region 122 is removed from the gate electrode 104 and spacer. Following formation of the contact vias 134, the contact via-defining photoresist mask is stripped, exposing the P-channel source region 126 and N-channel source region 128 of the silicon wafer 100.

Figure 4G:
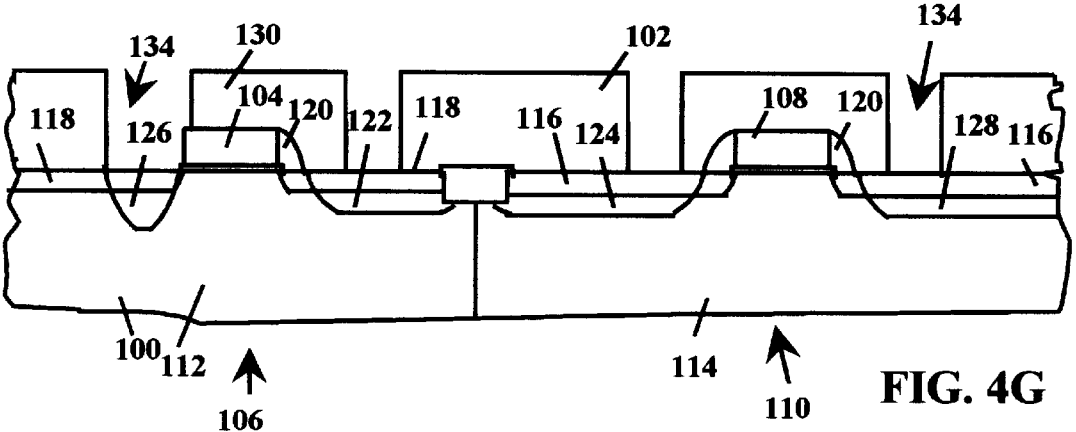

Referring to FIG. 4G, a source implant is performed to form heavily doped source regions including P-channel source regions 126. The P-channel source regions 126 are implanted into the silicon wafer 100 by applying a mask protecting drain regions of P-channel transistors 106 and N-channel transistors 110 and also protecting source regions of N-channel transistors 110. Source regions of P-channel transistors 106 are exposed to allow implanting of the sources of P-channel transistors 106. The heavily-doped P-channel source regions 126 are implanted by injecting boron atoms into a portion of the surface of the silicon wafer 100 that is self-aligned with the polysilicon gate 104 and the silicon dioxide spacer 120 on the drain side of the P-channel transistor 106. The boron atoms are implanted at a dosage in the range of $1 \times 10^{15}$ to $5 \times 10^{15}$ atoms/cm$^2$ and an energy in the range of 10 KeV to 80 KeV to produce a boron concentration in the range of about $1 \times 10^{18}$ to $5 \times 10^{20}$ atoms/cm$^3$ and a junction depth in the range of 200 Å to 3000 Å.

Following the source implant, the silicon wafer 100 is annealed to merge the heavily-doped source and drain regions with LDD regions for both P MOSFETs and N MOSFETs.

Figure 4H:
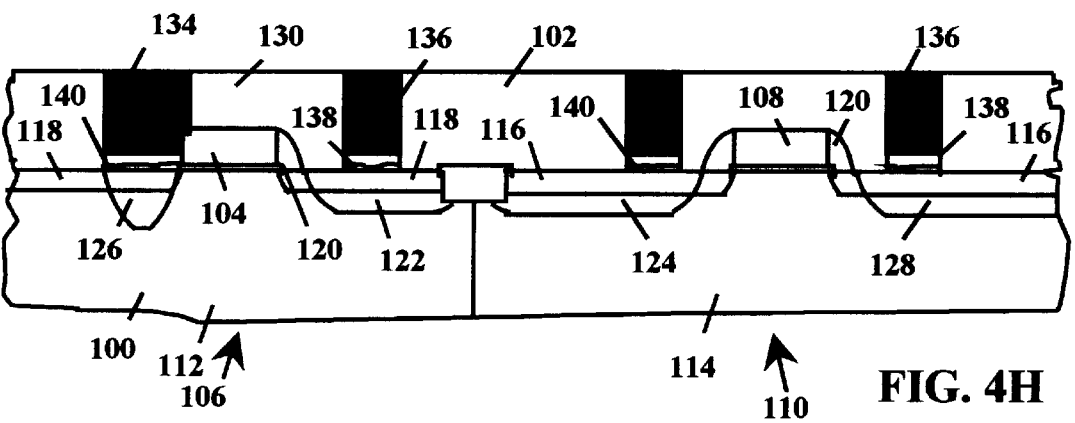

Referring to FIG. 4H, metal interconnects 136 form an electrical connection with the doped LDD regions in the vicinity of the N-channel source region 128 and the P-channel source region 126. The metal interconnects 136 form a connection with the LDD regions with the metal serving as a conductor.

The metal interconnects 136 are connected to the interconnect structures (not shown) to form a connection to an interconnect structure selectively connecting multiple transistors. In an illustrative embodiment, the metal interconnects 136 are formed by first depositing a titanium sacrificial barrier 138 into the contact vias 134 in contact with the source regions of the silicon wafer 100. Titanium films are used as a diffusion barrier since titanium (Ti) is an oxygen-gettering material and oxide-reducing agent. Accordingly, titanium dissolves a native oxide layer on the silicon surface of the silicon wafer 100 during annealing and adheres well to both silicon and oxide ($SiO_2$). In addition, titanium forms good ohmic contacts to heavily-doped silicon whether the doping is N-type doping or P-type doping. The illustrative structure advantageously facilitates circuit arrangements in which the sources of two or more transistors are connected.

In the illustrative embodiment, the metal interconnects 136 form a tungsten (W) interconnect. The titanium sacrificial barrier 138 between the polysilicon of the source regions of the silicon wafer 100 and the tungsten metal interconnects 136 function as a sacrificial barrier through the reaction of titanium with tungsten to form a titanium-tungsten alloy. The titanium sacrificial barrier 138 is formed by depositing a very thin layer of titanium onto the silicon wafer 100 including deposition into the contact vias 134. The silicon wafer 100 is annealed to react the titanium with the silicon in the undoped polysilicon, thereby forming $TiSi_2$. The titanium is deposited as a very thin layer to avoid absorption of dopants from the undoped polysilicon 132 during formation of $TiSi_2$.

Following the formation of the titanium sacrificial barrier 138, a titanium nitride (TiN) passive barrier 140 is formed over the titanium sacrificial barrier 138. The TiN passive barrier 140 serves as a contact diffusion barrier in silicon integrated circuits by operating as an impermeable barrier to silicon and by virtue of a high activation energy for the diffusion of other impurities. TiN has a high thermodynamic stability and a relatively low electrical resistivity of transition metal carbides, borides or nitrides. The TiN passive barrier 140 is formed using one of multiple techniques. For example, the TiN passive barrier 140 is formed by: (1) evaporating titanium in a nitrogen (N$_2$) ambient, (2) reactively sputtering the titanium in an argon (Ar)-nitrogen (N$_2$) mixture, (3) sputtering from a TiN target in an inert argon ambient, (4) sputter depositing titanium in an argon (Ar) ambient and converting the titanium to TiN is a separate plasma nitridation step, or (5) chemical vapor deposition (CVD).

The tungsten metal interconnects 136 are formed by chemical vapor deposition (CVD) of tungsten in a low pressure CVD reactor. Typically tungsten tetrafluoride WF$_6$ is used as a source gas for reduction by hydrogen or silicon in a two-step process. In a first step, the tungsten source is reduced by silicon to form a layer of tungsten approximately 100 Å thick. In a second step, hydrogen H$_2$ reduction is performed to deposit additional tungsten only on the tungsten layer formed in the first step. The metal interconnects 136 are formed in the contact vias 134 over the titanium sacrificial barrier 138 and the TiN passive barrier 140 by silicon reduction of tungsten tetrafluoride WF$_6$, leaving solid tungsten and silicon fluoride vapor.

Once the metal interconnects 136 are formed, chemical-mechanical polishing (CMP) is used to planarize the surface of the silicon wafer 100. CMP creates a smooth, planar surface for intermediate processing steps of an integrated circuit fabrication process and removes undesirable residues that remain from other substrate processing steps. CMP involves simultaneous chemically etching and mechanical polishing or grinding of a surface so that a combined chemical reaction and mechanical polishing removes a desired material from the substrate surface in a controlled manner. The resulting structure is a planarized substrate surface with any protruding surface topography leveled. CMP is typically performed by polishing a substrate surface against a polishing pad that is wetted with a slurry including an acidic or basic solution, an abrasive agent and a suspension fluid.

The metal interconnects 136 may be formed of metals other than tungsten. Tungsten advantageously tolerates high temperatures that occur during annealing.

Referring to FIG. 5, a computer system 400 includes an integrated circuit 402, a central processing unit 404, a memory 406, and an interface 408, connected to a modem 410. The computer system 400 also includes a keyboard 412 and a display 414 forming a user interface.

While the invention has been described with reference to various embodiments, it will be understood that these embodiments are illustrative and that the scope of the invention is not limited to them. Many variations, modifications, additions and improvements of the embodiments described are possible. For example, those skilled in the art will readily implement the steps necessary to provide the structures and methods disclosed herein, and will understand that the process parameters, materials, and dimensions are given by way of example only and can be varied to achieve the desired structure as well as modifications which are within the scope of the invention. Variations and modifications of the embodiments disclosed herein may be made based on the description set forth herein, without departing from the scope and spirit of the invention as set forth in the following claims.

For example, in some embodiments the P-channel transistor LDD regions 118 and the N-channel transistor LDD regions 116 are not implanted during the conventional process flow at a position in the sequence between gate formation and spacer formation but rather are implanted during the contact masking steps between the steps of etching contact vias 134 and depositing contact metallization Similarly, in some embodiments the P-channel drain regions 122 are not implanted during the conventional process flow but rather are implanted during the contact masking steps between the steps of etching contact vias 134 and depositing contact metallization.

What is claimed is:

1. An integrated circuit chip including an integrated circuit formed using the method of fabricating an integrated circuit comprising:

forming a plurality of lightly-doped drain (LDD) MOSFET structures including a gate on a substrate over a gate oxide layer, spacers abutting sides of the gate from a silicon dioxide material that is susceptible to oxide etching, and LDD doping of the substrate in a source region and a drain region self-aligned with the gate, the LDD MOSFET structures including LDD P-MOSFET structures and LDD N-MOSFET structures, the LDD N-MOSFETs having a heavily-doped drain doping in the drain region self-aligned with the gate and spacers, the LDD P-MOSFETs being undoped in a drain region;

forming an oxide layer over the substrate and the LDD P-MOSFET structures and the LDD N-MOSFET structures;

for the LDD P-MOSFET structures and the LDD N-MOSFET structures, cutting a contact via through the oxide layer to the substrate surface in the vicinity of the gate and spacer and abutting the source region of the substrate, the contact via being cut through the spacer on a source side of the gate overlying the source region, removing at least a portion of the source-side spacer so that the heavily-doped source implant is adjacent to the gate; and implanting a source implant through the contact via into the source of the LDD P-MOSFET structure.

2. An electronic system including a microprocessor, a memory, a system bus and an integrated circuit according to claim 1.

3. An integrated circuit comprising:

a lightly-doped drain (LDD) MOSFET structure including a gate electrode on a substrate over a gate oxide layer, spacers lateral to and abutting the gate electrode, the substrate including a source region and a drain region lightly doped with low concentration impurity regions in self-alignment with the gate electrode;

an oxide layer over the substrate and over the LDD MOSFET structure;

a source contact in a contact via extending through the oxide layer to the substrate surface in the vicinity of the gate and spacer and abutting the source region of the substrate; and a heavily-doped source implant self-aligned with the contact via by implantation through the contact via into the source region of the LDD MOSFET structure, wherein:

the spacers are formed from a silicon dioxide material that is susceptible to oxide etching; and the contact via cuts through the spacer on a source side of the gate overlying the source region, removing at least a portion of the source-side spacer so that the heavily-doped source implant is adjacent to the gate.

4. An integrated circuit according to claim 3, further comprising:

a heavily-doped drain implant implanted into the drain region and self-aligned with the gate and spacers.

5. An integrated circuit according to claim 3, wherein:
the spacers are formed from a silicon dioxide material that is susceptible to oxide etching; and
the contact via cuts through the spacer on a source side of the gate overlying the source region, removing at least a portion of the source-side spacer so that the heavily-doped source implant is adjacent to the gate.

6. An integrated circuit according to claim 3, further comprising:
a drain contact formed in a drain contact via cut through the oxide layer to the substrate surface in the vicinity of the gate and spacer but removed from the gate and spacer and abutting the drain region of the substrate; and
a drain implant implanted through the drain contact via into the drain of the LDD MOSFET structure.

7. An integrated circuit comprising:
a plurality of lightly-doped drain (LDD) MOSFET structures including a gate on a substrate over a gate oxide layer, spacers abutting sides of the gate from a silicon dioxide material that is susceptible to oxide etching, LDD doping of the substrate in a source region and a drain region self-aligned with the gate, the LDD MOSFET structures including LDD P-MOSFET structures and LDD N-MOSFET structures, the LDD N-MOSFETs having a heavily-doped drain doping in the drain region self-aligned with the gate and spacers, the LDD P-MOSFETs being undoped in a drain region;
an oxide layer over the substrate and the LDD P-MOSFET structures and the LDD N-MOSFET structures;
for the LDD P-MOSFET structures and the LDD N-MOSFET structures, a contact via extending through the oxide layer to the substrate surface in the vicinity of the gate and spacer and abutting the source region of the substrate, the contact via extending through the spacer on a source side of the gate overlying the source region, removing at least a portion of the source-side spacer so that the heavily-doped source implant is adjacent to the gate; and
a source implant implanted through the contact via into the source of the LDD P-MOSFET structure.

8. An integrated circuit according to claim 7, wherein the LDD P-MOSFET structure further includes:
a drain doping in the drain region self-aligned with the gate and spacers.

9. An integrated circuit according to claim 7, further comprising:
the contact via cut through the spacer on a source side of the gate, thereby removing the source-side spacer so that the source implant is adjacent to the gate.

10. An integrated circuit according to claim 7, further comprising:
a drain contact via extending through the oxide layer to the substrate surface in the vicinity of the gate and spacer but removed from the gate and spacer and abutting the drain region of the substrate; and
a drain implant implanted through the contact via into the drain of the MOSFET.

11. An integrated circuit according to claim 3, further comprising:
a plurality of LDD MOSFET structures including LDD P-MOSFET structures and LDD N-MOSFET structures, the LDD N-MOSFETs having a heavily-doped drain doping in an LDD N-MOSFET drain region self-aligned with the gate and spacers, the LDD P-MOSFETs having no heavy doping in an LDD P-MOSFET drain region.

12. An integrated circuit comprising:
a substrate;
a lightly-doped drain (LDD) MOSFET structure including a gate electrode on the substrate over a gate oxide layer, and a first sidewall spacer and a second sidewall spacer lateral to and abutting the gate electrode on a first side and a second side of the gate electrode, respectively, the first and second sidewall spacers being constructed of a silicon dioxide material that is susceptible to oxide etching, the substrate having light doping with low concentration impurity regions self-aligned with the gate electrode;
an oxide layer overlying the substrate and the LDD MOSFET structure, the oxide layer being etched to the substrate surface to form a contact via lateral to the gate electrode that is cut through at least a portion of the second sidewall spacer on the second side of the gate electrode; and
a high concentration impurity diffusion region that is self-aligned with the contact via by implanting a dopant through the contact via into a portion of the low concentration impurity region exposed by the contact via.

13. An integrated circuit according to claim 12, wherein:
a spacer of the lateral spacers is at least partially removed to form the contact via lateral to the gate electrode, thereby removing at least a portion of the spacer so that the high concentration impurity diffusion region is implanted in close proximity to the gate electrode.

14. An integrated circuit comprising:
a gate electrode on a gate oxide layer overlying a substrate;
lightly-doped first and second low concentration impurity regions in the substrate that are self-aligned with the gate electrode on respective first and second sides of the gate electrode;
first and second sidewall spacers lateral to and abutting the gate electrode on the respective first and second sides of the gate electrode;
a heavily-doped first high concentration impurity region in the substrate that is self-aligned with the first sidewall spacer and gate electrode on the first side of the gate electrode;
an insulating layer over the substrate, the gate electrode, and the first and second sidewall spacers, the insulating layer having a contact via etched to the substrate surface lateral to and on the second side of the gate electrode; and
a second high concentration impurity diffusion region that is aligned with the contact via by implanting a dopant through the contact via into the low concentration impurity region, wherein:
the sidewall spacers are formed of a silicon dioxide that is susceptible to oxide etching; and
the contact via is cut through at least a portion of the second sidewall spacer on the second side of the gate electrode so that the second side high concentration impurity diffusion region is more closely aligned to the gate electrode.

15. An integrated circuit according to claim 14, wherein:
the first side is a drain side and the first high concentration impurity region is a drain region; and the second side is a source side and the second high concentration impurity diffusion region is a source region.

16. An integrated circuit according to claim 14, wherein: the contact via on the second side of the gate electrode is cut through at least a portion of the second sidewall spacer so that the second side high concentration impurity diffusion region is more closely aligned to the gate electrode.

17. An integrated circuit chip including an integrated circuit formed using the method of fabricating an integrated circuit comprising:

forming a plurality of lightly-doped drain (LDD) MOSFET structures, the individual MOSFET structures including a gate on a substrate over a gate oxide layer, spacers on sides of the gate, and LDD doping of the substrate in a source region and a drain region self-aligned with the gate, the LDD MOSFET structures including LDD P-MOSFET structures and LDD N-MOSFET structures, the LDD N-MOSFETs having a heavily-doped source and drain doping in the respective source region and drain region self-aligned with the LDD N-MOSFET gate and spacers, the LDD P-MOSFETs being heavily-doped in a drain region with absence of heavy doping in a source region self-aligned with the LDD P-MOSFET gate and spacers;

forming an oxide layer over the substrate and the LDD P-MOSFET structures and the LDD N-MOSFET structures;

for the LDD P-MOSFET structures and the LDD N-MOSFET structures, cutting a contact via through the oxide layer to the substrate surface in the vicinity of the gate and spacer and abutting the source region of the substrate;

implanting a source implant through the contact via into the source of the LDD P-MOSFET structure;

cutting a drain contact via through the oxide layer to the substrate surface in the vicinity of the gate and spacer but removed from the gate and spacer and abutting the drain region of the substrate; and forming a drain contact in the drain contact via.

18. An integrated circuit comprising:

a lightly-doped drain (LDD) MOSFET structure including a gate electrode on a substrate over a gate oxide layer, spacers lateral to and abutting the gate electrode, the substrate including a source region and a drain region lightly doped with low concentration impurity regions in self-alignment with the gate electrode;

an oxide layer over the substrate and over the LDD MOSFET structure;

a source contact in a contact via extending through the oxide layer to the substrate surface in the vicinity of the gate and spacer and abutting the source region of the substrate; and a heavily-doped source implant self-aligned with the contact via by implantation through the contact via into the source region of the LDD MOSFET structure;

a drain contact via through the oxide layer to the substrate surface in the vicinity of the gate and spacer but removed from the gate and spacer and abutting the drain region of the substrate;

a drain contact in the drain contact via; and a drain implant through the drain contact via into the drain of the LDD MOSFET structure.

19. An integrated circuit comprising:

a lightly-doped drain (LDD) MOSFET structure including a gate electrode on a substrate over a gate oxide layer, spacers lateral to and abutting the gate electrode, the substrate including a source region and a drain region lightly doped with low concentration impurity regions in self-alignment with the gate electrode;

an oxide layer over the substrate and over the LDD MOSFET structure;

a source contact in a contact via extending through the oxide layer to the substrate surface in the vicinity of the gate and spacer and abutting the source region of the substrate; and a heavily-doped source implant self-aligned with the contact via by implantation through the contact via into the source region of the LDD MOSFET structure;

a drain contact via through the oxide layer to the substrate surface in the vicinity of the gate and spacer but removed from the gate and spacer and abutting the drain region of the substrate;

a drain implant through the drain contact via into the drain of the LDD MOSFET structure; and a drain contact in the drain contact via.

20. An integrated circuit comprising:

a plurality of lightly-doped drain (LDD) MOSFET structures, the individual MOSFET structures including a gate on a substrate over a gate oxide layer, spacers on sides of the gate, and LDD doping of the substrate in a source region and a drain region self-aligned with the gate, the LDD MOSFET structures including LDD P-MOSFET structures and LDD N-MOSFET structures, the LDD N-MOSFETs having a heavily-doped source and drain doping in the respective source region and drain region self-aligned with the LDD N-MOSFET gate and spacers, the LDD P-MOSFETs being heavily-doped in a drain region with absence of heavy doping in a source region self-aligned with the LDD P-MOSFET gate and spacers;

an oxide layer over the substrate and the LDD P-MOSFET structures and the LDD N-MOSFET structures;

for the LDD P-MOSFET structures and the LDD N-MOSFET structures, a contact via extending through the oxide layer to the substrate surface in the vicinity of the gate and spacer and abutting the source region of the substrate; and a source implant in the source of the LDD P-MOSFET structure, self-aligned with the contact via.

21. An integrated circuit comprising:

a substrate;

a lightly-doped drain (LDD) MOSFET structure including a gate electrode on the substrate over a gate oxide layer, and spacers lateral to and abutting the gate electrode, the substrate being lightly doped with low concentration impurity regions formed self-aligned with the gate electrode;

an oxide layer overlying the substrate and the LDD MOSFET structure, the oxide layer being etched to the substrate surface to form a contact via lateral to the gate electrode;

a high concentration impurity diffusion region that is self-aligned with the contact via by implanting a dopant through the contact via into a portion of the low concentration impurity region exposed by the contact via;

a drain contact via formed through the oxide layer to the substrate surface in the vicinity of the gate and spacer but removed from the gate and spacer and abutting the drain region of the substrate;

a drain contact in the drain contact via; and a drain implant through the drain contact via into the drain of the LDD MOSFET structure.

22. An integrated circuit according to claim 21 wherein:

the spacers are formed from a silicon dioxide material that is susceptible to oxide etching; and the contact via is formed through the spacer on a source side of the gate overlying the source region, removing at least a portion of the source-side spacer so that the heavily-doped source implant is adjacent to the gate.

* * * * *